(12) United States Patent
Fukazawa et al.

(10) Patent No.: US 8,784,950 B2
(45) Date of Patent: Jul. 22, 2014

(54) METHOD FOR FORMING ALUMINUM OXIDE FILM USING AL COMPOUND CONTAINING ALKYL GROUP AND ALKOXY OR ALKYLAMINE GROUP

(75) Inventors: Atsuki Fukazawa, Tama (JP); Hideaki Fukuda, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/550,419

(22) Filed: Jul. 16, 2012

(65) Prior Publication Data
US 2014/0017414 A1 Jan. 16, 2014

(51) Int. Cl.
*H05H 1/24* (2006.01)
*C23C 16/00* (2006.01)

(52) U.S. Cl.
USPC ......... 427/576; 427/569; 427/248.1; 427/250

(58) Field of Classification Search
CPC ................. C23C 16/45525; C23C 16/45527; C23C 16/45536; C23C 16/45529; C23C 16/4554; C23C 16/45542; C23C 16/50; H05H 1/24
USPC .............................. 427/576, 569, 248.1, 250
See application file for complete search history.

(56) References Cited

U.S. PATENT DOCUMENTS

| | | | |
|---|---|---|---|
| 6,743,475 B2 | 6/2004 | Skarp et al. | |
| 7,589,029 B2 * | 9/2009 | Derderian et al. | 438/785 |
| 7,682,657 B2 | 3/2010 | Sherman | |
| 2003/0003635 A1 * | 1/2003 | Paranjpe et al. | 438/149 |
| 2005/0003662 A1 | 1/2005 | Jurisch et al. | |
| 2010/0255625 A1 * | 10/2010 | De Vries | 438/57 |

FOREIGN PATENT DOCUMENTS

EP 2 426 233 A1 * 7/2012

OTHER PUBLICATIONS

Characteristics of $Al_2O_3$ Thin Films Deposited Using Dimethylaluminum Isopropoxide and Trimethylaluminum Precursors by the Plasma-Enhanced Atomic-Layer Deposition Method, Journal of the Korean Physical Society, vol. 48, No. 1, Jan. 2006, pp. 131-136.
ALD and Characterization of Aluminum Oxide Deposited on Si (100) using Tris(diethylamino) Aluminum and Water Vapor, Journal of the Electrochemical Society, 153 (10) C701-C706 (2006).

* cited by examiner

*Primary Examiner* — Kelly M Gambetta
(74) *Attorney, Agent, or Firm* — Snell & Wilmer L.L.P.

(57) ABSTRACT

A method for forming a conformal film of aluminum oxide on a substrate having a patterned underlying layer by PEALD includes: adsorbing an Al precursor containing an Al—C bond and an Al—O—C or Al—N—C bond; providing an oxidizing gas and an inert gas; applying RF power to the reactant gas and the reaction-assisting gas to react the adsorbed precursor with the reactant gas on the surface, thereby forming a conformal film of aluminum oxide on the patterned underlying layer of the substrate, wherein the substrate is kept at a temperature of about 200° C. or lower.

7 Claims, 2 Drawing Sheets

METHOD FOR FORMING ALUMINUM OXIDE FILM USING AL COMPOUND CONTAINING ALKYL GROUP AND ALKOXY OR ALKYLAMINE GROUP

BACKGROUND OF THE INVENTION

1. Field of the Invention

The present invention generally relates to a method for forming an aluminum oxide film, in particular, to a method for forming an aluminum oxide film by plasma-enhanced atomic layer deposition (PEALD) using an Al compound having an alkyl group and an alkoxy or alkylamine group.

2. Description of the Related Art

A process of depositing a thin film of $Al_2O_3$ on a substrate by atomic layer deposition (ALD) is commonly performed using a trimethyl aluminum (TMA) as disclosed in U.S. Pat. No. 7,682,657. However, TMA is pyrophoric, requiring special handling and storage precautions.

SUMMARY OF THE INVENTION

Some embodiments provide a method for forming a conformal film of aluminum oxide on a substrate having a patterned underlying layer by plasma-enhanced atomic layer deposition (PEALD), which comprises: (i) adsorbing a precursor on a surface of the substrate, said precursor being an aluminum compound containing an Al—C bond and an Al—O—C or Al—N—C bond; (ii) providing a reactant gas and a reaction-assisting gas over the surface of the substrate, said reactant gas being an oxidizing gas, said reaction-assisting gas being an inert gas; (iii) applying RF power to the reactant gas and the reaction-assisting gas to react the adsorbed precursor with the reactant gas on the surface; and (iv) repeating steps (i) to (iii) to form a conformal film of aluminum oxide on the patterned underlying layer of the substrate, wherein the substrate is kept at a temperature of about 200° C. or lower. Accordingly, as compared with use of TMA, safety with regard to handling and storage of the precursor can be ensured, and damage caused to an underlying layer by deposition of the aluminum oxide film thereon can be minimized while maintaining as a high deposition rate as that of TMA.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
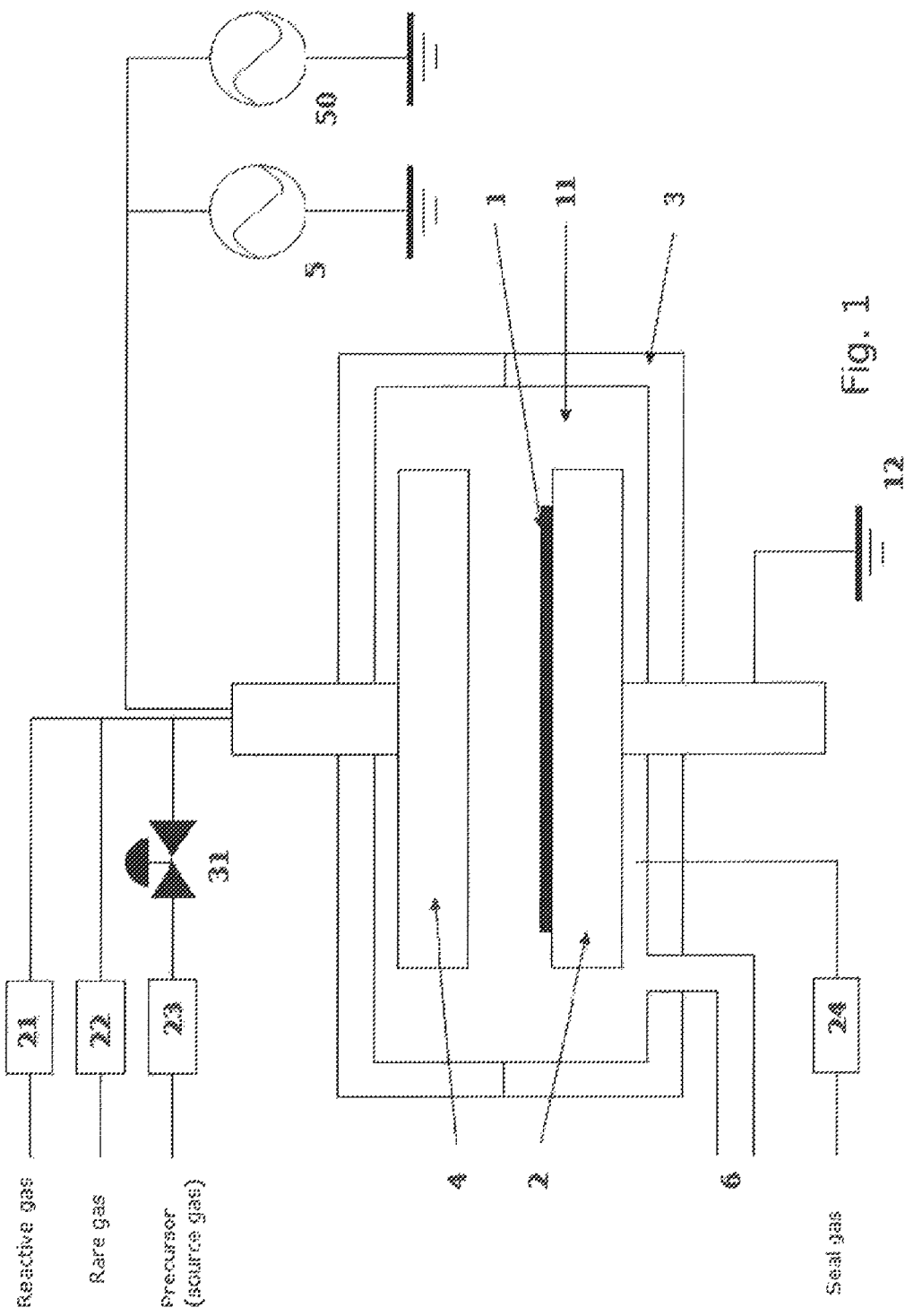
FIG. 1 is a schematic representation of a PEALD apparatus for depositing a dielectric film usable in some embodiments of the present invention.

In this disclosure, "a film of aluminum oxide" may refer to a film characterized by Al—O bonds, a film constituted mainly or predominantly by Al—O bonds, a film categorized as Al—O films, and/or a film having a main skeleton substantially constituted by Al—O bonds. Typically, the film of aluminum oxide is an $Al_2O_3$ film. In some embodiments, "film" refers to a layer composed of multiple monolayers (composed of the same monolayers or different monolayers) and continuously extending in a direction. perpendicular to a thickness direction substantially without pinholes to cover an entire target or concerned surface, or simply a layer covering a target or concerned surface. A film or layer may be constituted by a discrete single film or a layer having a common characteristic.

In this disclosure, a "gas" may include vaporized solid and/or liquid and may be constituted by a single gas or a mixture of gases. Likewise, "a" refers to a species or a genus including multiple species, In this disclosure, the precursor, the reactant gas, and the reaction-assisting gas are different from each other or mutually exclusive in terms of gas types, i.e., there is no overlap of gas types among these categories. In this disclosure, the precursor may include a rare gas as a carrier gas when the precursor is vaporized and carried by a rare gas, and the flow of the precursor is controlled by the inflow pressure (the pressure of gas flowing into a reactor). Further, the precursor is a material from which the film is derived and which provides main elements of the film, The reactant gas may be any gas causing surface reaction in an excited state with the precursor chemiadsorbed on a surface to fix a monolayer of the precursor on the surface by ALD. Typically, the reactant gas is an oxidizing gas. The reaction-assisting gas may be any gas assisting reaction between the precursor and the reactant gas by controlling glowing conditions and ionization of the reactant gas by plasma. Typically, the reaction-assisting gas is an inert gas. In some embodiments, the reactant gas and the reaction-assisting gas can be supplied separately (with the same or different timings) from each other or supplied together, and can also function as a purge gas when the reactant gas and/or the reaction-assisting gas are/is continuously introduced. In the above, "continuously" refers to without breaking a vacuum, without interruption as a timeline, without changing treatment conditions, immediately thereafter, as a next step, or without a discrete physical or chemical boundary between two structures in some embodiments.

Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

The embodiments will be explained with respect to preferred embodiments. However, the present invention is not limited to the preferred embodiments.

As discussed above, some embodiments provide a method for forming a conformal film of aluminum oxide on a substrate having a patterned underlying layer by plasma-enhanced atomic layer deposition (PEALD), which comprises: (i) adsorbing a precursor on a surface of the substrate, said precursor being an aluminum compound containing an Al—C bond and an Al—O—C or Al—N—C bond; (ii) providing a reactant gas and a reaction-assisting gas over the surface of the substrate, said reactant gas being an oxidizing gas, said reaction-assisting gas being an inert gas; (iii) applying RF power to the reactant gas and the reaction-assisting gas to react the adsorbed precursor with the reactant gas on the surface; and (iv) repeating steps (i) to (iii) to form a conformal film of aluminum oxide on the patterned underlying layer of the substrate, wherein the substrate is kept at a temperature of about 200° C. or lower.

In some embodiments, the patterned underlying layer may be a photoresist or a layer of amorphous carbon, SiO, SiN, or silicon, which may be used in patterning processes. Since damage to the underlying layer can be suppressed in some embodiments, an aluminum oxide film can be deposited on a photoresist such as that having typically a shrinkage of 10% or higher when being processed at a temperature of e.g., about 100° C. or higher. In some embodiments, the pattern may have recesses, Wherein each patterned recess includes a top surface, side wall, and bottom surface. In some embodiments, the aluminum oxide film has a side wall coverage of at least about 90% (preferably about 95% or higher), which is defined as a ratio of thickness of film deposited on the side wall to thickness of film deposited on the top surface, where the recess is a Si-line pattern having an opening of 50 to 100 nm and an aspect ratio of 2 to 4. Side wall coverage may be referred to as "conformality".

In some embodiments, the precursor is one or more aluminum compounds containing one or two alkyl groups and one or two alkoxy or alkylamine groups in its molecule, wherein the total number of groups attached to aluminum is three. Alternatively, the aluminum compound may contain an alkynyl group and/or an alkyloxy or alkylamine group. In some embodiments, the aluminum compound is halogen-free. In some embodiments, the precursor is at least one aluminum compound selected from the group consisting of $Al(C_xH_y)_2(OC_zH_a)$, $Al(C_xH_y)(OC_zH_a)_2$, and $Al(C_xH_y)_2(NC_zH_a)$, wherein x, y, z, and a are integers. In some embodiments, x is two or more (e.g., 2 to 5), y is three or more (e.g., 3 to 11), z is three or more (e.g., 3 to 6), and a is five or more (e.g., 5 to 13). Typically, the aluminum compound includes $Al(CH_3)_2(OC_3H_7)$, $Al(CH_3)(OC_3H_7)_2$, and $Al(CH_3)_2(NC_3H_7)$.

In some embodiments, the reactant gas is oxygen gas or an oxygen-containing gas such as ozone, nitrogen oxide, etc., which is capable of generating an oxygen plasma.

In some embodiments, the reaction-assisting gas is at least one gas selected from rare gases such as Ar, He, Kr, and Xe, and nitrogen gas. By using the reaction-assisting gas, glow conditions and ionization of the reactant gas can be promoted so as to further suppress damage to the underlying layer.

In some embodiments, the substrate temperature is about 0° C. to about 200° C., preferably higher than about 0° C. but lower than about 100° C., so that the growth rate per cycle can be maximized while minimizing damage to the underlying layer.

In some embodiments, steps (i) to (iii) comprise: (a) supplying the precursor, the reactant gas, and the reaction-assisting gas to a reaction space where the substrate is placed, without applying RF power, thereby adsorbing the precursor on the surface of the substrate; (b) continuously supplying the reactant gas and the reaction-assisting gas while discontinuing the supply of the precursor, without applying RF power, thereby purging the surface of the substrate; (c) applying RF power to the reaction space while continuously supplying the reactant gas and the reaction-assisting gas without the supply of the precursor, thereby reacting the adsorbed precursor and the reactant gas on the surface; and (d) continuously supplying the reactant gas and the reaction-assisting gas, without the supply of the precursor, discontinuing the RF power, thereby purging the surface of the substrate, where steps (a) to (d) constitute one cycle of the plasma enhanced ALD.

Figure 2:
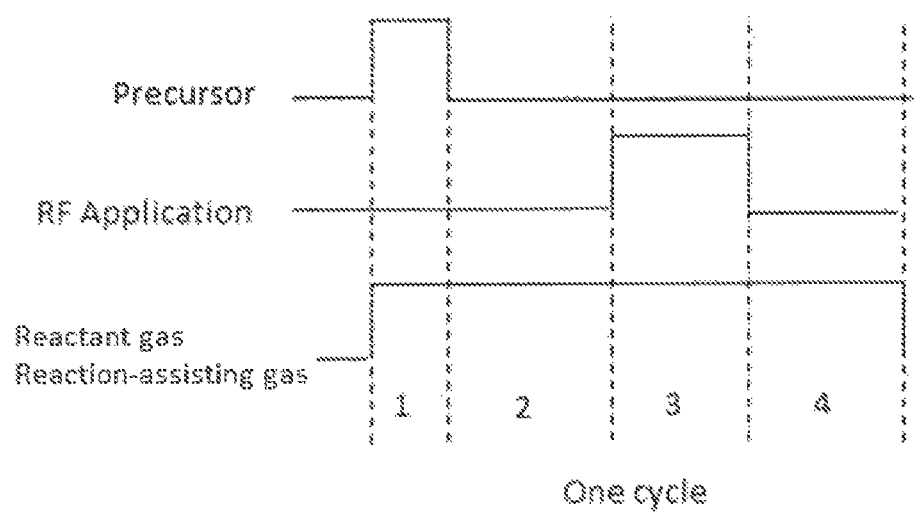
FIG. 2 shows process steps of a PEALD method for depositing a dielectric film according to an embodiment of the present invention.

FIG. 2 shows process steps of a PEALD method for depositing an aluminum oxide film according to an embodiment of the present invention. In FIG. 2, the PEALD method repeats a cycle which is constituted by steps 1 to 4. In step 1 which is a precursor adsorption step, a precursor is supplied in a pulse, a reactant gas and a reaction-assisting gas are supplied, and no RF power is applied. In step 2 which is a purge step, no precursor is supplied, the reactant gas and the reaction-assisting gas are continuously supplied, and no RF power is applied. The reactant gas and the reaction-assisting gas function as a purge gas. In step 3 which is a surface reaction step, no precursor is supplied, the reactant gas and the reaction-assisting gas are continuously supplied, and RF power is applied. In step 4 which is a purge step, no precursor is supplied, the reactant gas and the reaction-assisting gas are continuously supplied, and no RF power is applied. The reactant gas and the reaction assisting gas function as a purge gas. In some embodiments, in step 1, two or more precursors can be supplied in separate pulses or in the same pulse. In some embodiments, a separate purge gas can be used for purging, and vacuum can also be used for purging, wherein the reactant gas may be supplied only in step 3. Steps 2 and 4 can be conducted in any manner as long as the non-adsorbed precursor in step 2 and the non-reacted product in step 4 are removed from the surface. In some embodiments, the reaction gas and the reaction-assisting gas may be supplied in different pulses, where the reaction-assisting gas is continuously supplied and the reactant gas is supplied only in step 3 where RF power is applied.

In some embodiments, the precursor is supplied using a carrier gas, wherein the precursor is vaporized in a tank under an equilibrium vaporization pressure, and the vaporized precursor is supplied with a carrier gas to a reactor, wherein the flow of the precursor is controlled by the inflow gas pressure (the pressure of gas flowing into the reactor). Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

In PEALD, in some embodiments, the following conditions may be employed:
  Substrate temperature: 0 to 200° C. (preferably about 0 to about 100° C.)
  Precursor pressure: 50 to 1333 Pa (preferably about 100 to about 500 Pa)
  Carrier gas (e.g., Ar or He) flow: 500 to 4,000 sccm (preferably about 1,000 to about 2,500 sccm)
  Precursor pulse: 0.1 to 10 seconds (preferably about 0.3 to about 3 seconds)
  Purge upon the precursor pulse: 0.1 to 10 seconds (preferably about 0.3 to about 3 seconds)
  RF frequency: 13.56 to 60 MHz RF power; 10 to 500 W (preferably about 30 to about 100 W for a 300-mm wafer)

RF power pulse: 0.1 to 20 seconds (preferably about 0.5 to 10 seconds)

Reactant gas flow: 10 to 1,000 sccm (preferably, about 50 to 300 sccm)

Reaction-assisting gas flow: 100 to 3,000 sccm (more than reactant gas flow; preferably about 500 to 2,000 sccm)

Purge upon the RF power pulse: 0.1 to 10 seconds (preferably about 0.3 to about 1 seconds)

Duration of one cycle: 1 to 30 seconds

Number of cycles repeated: 300 to 1,000

Thickness of film: 5 to 30 nm

Film can also be formed by cyclic CVD, thermal ALD or radical-enhanced ALD instead of plasma-enhanced ALD, but plasma-enhanced ALD is preferred in terms of productivity and minimized damage because thermal ALD requires a longer time and higher temperature for replacement reaction, Note that plasma-enhanced ALD, thermal ALD, etc, are interchangeable in an embodiment despite their differences in productivity, etc., and a skilled artisan will appreciate appropriate process sequences based on this disclosure and routine experiment.

FIG. 1 is a schematic view of a plasma-enhanced ALD reactor with flow control valves, which can be used in some embodiments of the present invention.

In this example, by providing a pair of electrically conductive flat-plate electrodes 4, 2 in parallel and facing each other in the interior 11 of a reaction chamber 3, applying HRF power (having a frequency of 13.56 MHz or 27 MHz) 5 and LRF power having a frequency of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). For the pulse flow control valve 31, a pulse supply valve that is used for ALD can suitably be used in some embodiments.

The disclosed embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE

An aluminum oxide film was formed on a 300-mm substrate having a patterned resist with an aspect ratio of about 2.5 and an opening width of about 50 nm under the conditions shown below using the sequence illustrated in FIG. 2 and the PEALD apparatus illustrated in FIG. 1. The thickness of film was 30 nm for evaluating film properties.

PEALD:
Precursor (without heating): see Table 1
Precursor inflow pressure: 200 Pa
Substrate temperature: see Table 1
Carrier gas flow: Ar at 1.5 SLM
Reactant gas flow (continuous): $O_2$ at 0.1 SLM
Reaction-assisting gas flow (continuous): He at 1 SLM
RF frequency; 13.56 MHz
RF power: 50 W
Precursor supply time (Step 1): see Table 1
Purge time after precursor pulse (Step 2): see Table 1
RF Plasma excitation time (Step 3): see Table 1
Purge time after RF application (Step 4): see Table 1

TABLE 1

|  | Precursor | Temp. [° C.] | Pre-pulse/Prg/RF/Prg [seconds] |
|---|---|---|---|
| Com. | $Al(CH_3)_3$ | 50 | 0.2/1/1/0.3 |
| Ex. 1 | $Al(CH_3)_2(OC_3H_7)$ | 50 | 0.5/1/1/0.3 |
| Ex. 2 | $Al(CH_3)_2(OC_3H_7)$ | 100 | 0.5/1/1/0.3 |
| Ex. 3 | $Al(CH_3)(OC_3H_7)_2$ | 100 | 1/1/1/0.3 |
| Ex. 4 | $Al(CH_3)(OC_3H_7)_2$ | 50 | 1/1/1/0.3 |

The step coverage, growth per cycle, and resist shrinkage were evaluated for each resultant film. The results are shown in Table 2.

TABLE 2

|  | Step coverage (AR: 2.5 pattern) | Growth rate per cycle | Resist shrinkage |
|---|---|---|---|
| Com. | >95% | 0.2 nm/cycle | 15% |
| Ex. 1 | >95% | 0.18 nm/cycle | 5% |
| Ex. 2 | >95% | 0.14 nm/cycle | 8% |
| Ex. 3 | >95% | 0.12 nm/cycle | 9% |
| Ex. 4 | >95% | 0.17 nm/cycle | 5% |

As can be seen from Table 2, as compared with TMA (the Al compound with three methyl groups), when the alkyl alkoxy aluminum (the Al compounds with one or two methyl groups and one or two isopropoxy groups) was used, damage to the resist was suppressed. Further, when the process temperature was lower (in some embodiments, at about 0° C. to about 50° C.), the growth rate per cycle of the alkyl alkoxy aluminum was equivalent to that of TMA. Additionally, the step coverage (conformality) was higher than 95% in all the cases.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a conformal film of aluminum oxide on a patterned underlying layer of a substrate by plasma-enhanced atomic layer deposition (PEALD), said patterned underlying layer being a photoresist or a layer of amorphous carbon, said method comprises:
  (i) adsorbing a precursor on a surface of the substrate in a reaction space whose pressure is controlled at 50 to 1,333 Pa, said precursor being an aluminum compound containing an Al—C bond and an Al—O—C or Al—N—C bond, said substrate being disposed between electrically conductive flat-plate electrodes, wherein the precursor is at least one aluminum compound selected from the group consisting of $Al(C_xH_y(OC_zH_a)_2$ and $Al(C_xH_y)_2(NC_zH_a)$, wherein x, y, z, and a are integers, said precursor being provided with a carrier gas flowing at a rate of 500 to 4,000 sccm;

(ii) providing a reactant gas at a flow rate of 10 to 1,000 sccm and a reaction-assisting gas at a flow rate of 500 to 2,000 sccm over the surface of the substrate, said reactant gas being an oxidizing gas, said reaction-assisting gas being an inert gas;

(iii) applying RF power from the electrodes to the reactant gas and the reaction-assisting gas to react the adsorbed precursor with the reactant gas on the surface; and (iv) repeating steps (i) to (iii) to form a conformal film of aluminum oxide on the patterned underlying layer of the substrate, wherein the substrate is kept at a temperature of about 200° C. or lower.

2. The method according to claim 1, wherein the conformal film has a conformality of more than about 95%.

3. The method according to claim 1, wherein the reactant gas is oxygen gas.

4. The method according to claim 1, wherein the reaction-assisting gas is at least one gas selected from rare gases and nitrogen gas.

5. The method according to claim 1, wherein steps (i) to (iii) comprise:

(a) supplying the precursor, the reactant gas, and the reaction-assisting gas to the reaction space where the substrate is placed, without applying RF power, thereby adsorbing the precursor on the surface of the substrate;

(b) continuously supplying the reactant gas and the reaction-assisting gas while discontinuing the supply of the precursor, without applying RF power, thereby purging the surface of the substrate;

(c) applying RF power to the reaction space while continuously supplying the reactant gas and the reaction-assisting gas without the supply of the precursor, thereby reacting the adsorbed precursor and the reactant gas on the surface; and (d) continuously supplying the reactant gas and the reaction-assisting gas, without the supply of the precursor, discontinuing the RF power, thereby purging the surface of the substrate, where steps (a) to (d) constitute one cycle of the plasma enhanced ALD.

6. The method according to claim 1, wherein the temperature of the substrate is about 100° C. or lower.

7. The method according to claim 1, wherein the reaction-assisting gas is supplied at a flow rate higher than that of the reaction gas.

* * * * *